(12) United States Patent
Popescu et al.

(10) Patent No.: US 6,169,452 B1
(45) Date of Patent: Jan. 2, 2001

(54) GAIN CONTROL, VARIABLE GAIN AND AUTOMATIC GAIN CONTROL AMPLIFIERS INCLUDING DIFFERENTIAL CIRCUIT TRANSISTORS AND CURRENT SPLITTER

(75) Inventors: Petre Popescu, Kanata; Mark S. Wight, Ottawa; Kathryn Louise Howlett, Kanata, all of (CA)

(73) Assignee: Nortel Networks Corporation, Montreal (CA)

( * ) Notice: Under 35 U.S.C. 154(b), the term of this patent shall be extended for 0 days.

(21) Appl. No.: 09/226,154

(22) Filed: Jan. 7, 1999

(51) Int. Cl.[7] .................................................. H03F 3/45
(52) U.S. Cl. ............................. 330/254; 327/359
(58) Field of Search ............................. 330/254; 327/359

(56) References Cited

U.S. PATENT DOCUMENTS 5,896,063 * 4/1999 Marsh .................................. 327/359

* cited by examiner

Primary Examiner—Michael B Shingleton
(74) Attorney, Agent, or Firm—Angela C. de Wilton

(57) ABSTRACT

A gain control amplifier includes an input differential circuit having a pair of transistors, the emitters of which are coupled via a pair of emitter resistors. The input differential circuit includes a current sink for providing an operating current. With variation of the operating current, the gain control amplifier's gain is varied. Two emitter coupled differential amplifiers are connected to the input differential circuit having a current sink. A current flowing in the transistors of the emitter coupled differential amplifier and the input differential circuit is split by an additional emitter coupled differential circuit having a current sink. A current splitting factor is controlled in response to the voltage difference between the collectors of the two transistors of the two emitter coupled differential amplifiers. Since the relatively small currents flow in the emitter resistors, noise caused thereby is relatively low. Thus, it provides a wide input dynamic range with low noise. The gain control amplifier is used in a variable gain amplifier and an automatic gain control amplifier.

14 Claims, 8 Drawing Sheets

GAIN CONTROL, VARIABLE GAIN AND AUTOMATIC GAIN CONTROL AMPLIFIERS INCLUDING DIFFERENTIAL CIRCUIT TRANSISTORS AND CURRENT SPLITTER

TECHNICAL FIELD

The present invention relates to a gain control amplifier, a variable gain amplifier and an automatic gain control amplifier using the variable gain amplifier.

BACKGROUND INFORMATION

Automatic gain control (AGC) amplifiers are commonly used in receivers. The overall performance of receivers depend on the input dynamic ranges and noise factors of the AGC amplifiers. The input dynamic range is defined by the ratio of the maximum input signal amplitude for linear operation of the AGC amplifier and the minimum input signal for which the output amplitude is the nominal output amplitude of the amplifier. The output dynamic range is defined as the ratio of the maximum output signal and the minimum output signal for a given input dynamic range. For most of the applications, the input dynamic range is 100 to 300 (40 to 50 dB) and the output dynamic range is 1.2 to 1.5 (1.5 to 3.5 dB). The noise factor is a measure of the amplifier equivalent input noise and is defined as the degradation of the signal to noise ratio due to the AGC noise. In general, the input dynamic range for linear operations must be large to accommodate without degradation different applications and the equivalent input noise must be low to minimize the signal to nose ratio degradation.

SUMMARY OF THE INVENTION

It is an object of the present invention to provide improved gain control amplifier, variable gain amplifier and AGC amplifier.

According to one aspect of the present invention, there is provided a gain control amplifier for amplifying an input voltage and providing an amplified output voltage, comprising first, second and third differential circuits and current split means.

The first differential circuit comprises first and second transistors, the emitters of which are coupled, and a first load element connected to the collector of the first transistor.

The second differential circuit comprises third and fourth transistors, the emitters of which are coupled, and a second load element connected to the collector of the fourth transistor, the bases of the third and fourth transistors being coupled to the bases of the second and first transistors, respectively, the amplified output voltage being provided from the collectors of the first and fourth transistors.

The third differential circuit comprises fifth and sixth transistors, the emitters of which are coupled through a pair of resistance elements, the junction of the resistance elements being connected to a first current circuit, the collector of the fifth transistor being connected to the coupled emitters of the first and second transistors, the collector of the sixth transistor being connected to the coupled emitters of the third and fourth transistors, the input voltage being fed to the bases of the fifth and sixth transistors.

In the gain control amplifier, the current split means splits current flowing in the first and second load elements from the respective transistors. The current flowing in the fifth transistor of the third differential circuit is proportional to the difference between the current flowing in the first load element and the split current. Similarly, the current flowing in the sixth transistor of the third differential circuit is proportional to the difference between the current flowing in the second load element and the split current. Due to current splitting, relatively small currents drive the fifth and sixth transistors which amplify the input voltage. Since the relatively small currents flow in the resistance elements coupled to the emitters of the fifth and sixth transistors, noise caused by the transistors is relatively low. Thus, it provides a wide input dynamic range with low noise.

For example, the current split means comprises fourth and fifth differential circuits. The fourth differential circuit comprises seventh and eighth transistors, the emitters of which are coupled, the coupled emitters being connected to a second current circuit, the collector of the seventh transistor being connected to the collector of the first transistor, the bases of the seventh and eight transistors being connected to the bases of the second and first transistors, respectively. The fifth differential circuit comprises ninth and tenth transistors, the emitters of which are coupled, the coupled emitters being connected to a third current circuit, the collector of the tenth transistor being connected to the collector of the fourth transistor, the bases of the ninth and tenth transistors being connected to the bases of the fourth and third transistors, respectively. The current split means further comprises split control means for controlling currents flowing in the transistors of the differential circuits in response to a voltage difference between the voltages at the collectors of the first and fourth transistors. The split control means comprises base voltage control means for generating a variable base voltage in response to the voltage difference, the variable base voltage being fed to the bases of the transistors of the first, second, fourth and fifth differential circuits. In response to the variable base voltage, the currents flowing in the transistors of the first, second, fourth and fifth differential circuits are varied to vary the amplifier's gain.

According to another aspect of the present invention, there is provided a variable gain amplifier comprising: an input stage amplifier for amplifying an input voltage; and a main amplifier for further amplifying an input stage amplified voltage and providing an output voltage, the input stage amplifier comprising the gain control amplifier.

According to another aspect of the present invention, there is provided an automatic gain control amplifier comprising: the variable gain amplifier, the variable gain amplifier amplifying an input voltage and providing an amplified voltage; detection means for detecting variations of the output voltage of the variable gain amplifier; and means for comparing the detected output to a reference voltage and providing again control voltage to the variable gain amplifier.

BRIEF DESCRIPTION OF THE DRAWINGS

Embodiments of the present invention will now be described by way of example with reference to the accompanying drawings in which.

DETAILED DESCRIPTION

I. Prior Art

Figure 1:
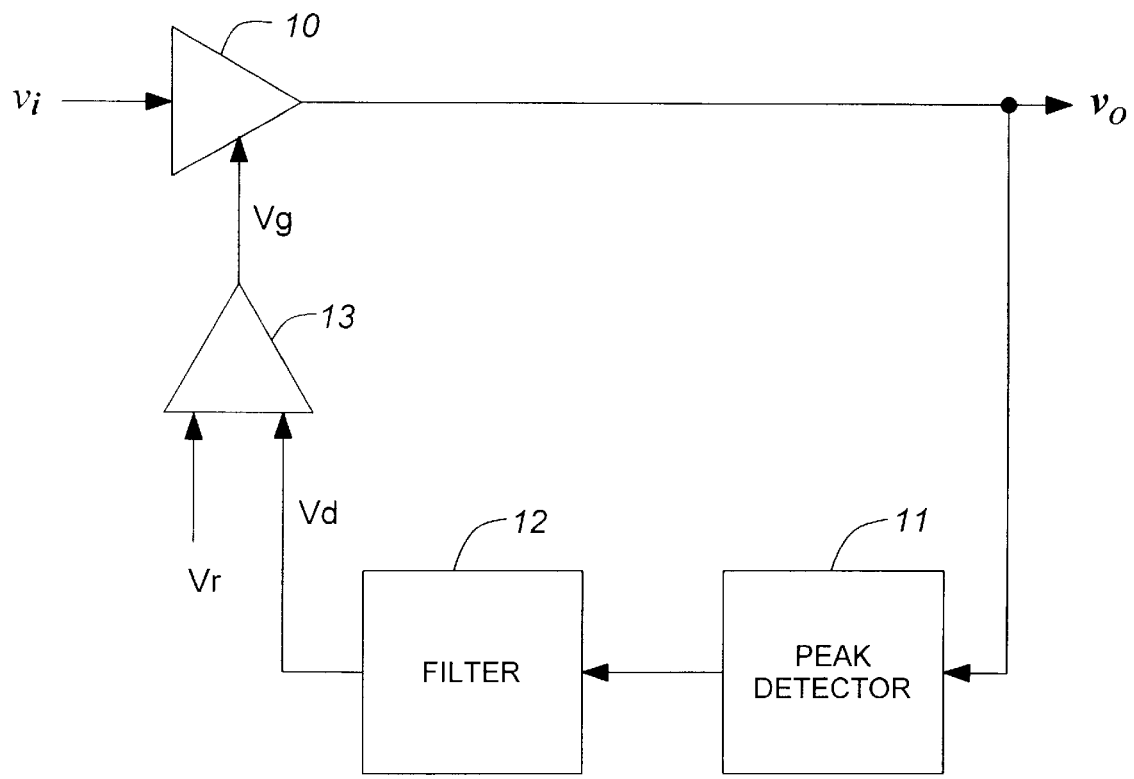
FIG. 1 is a block diagram of a prior art AGC amplifier.

FIG. 1 shows a prior art AGC amplifier including a voltage controlled amplifier 10, a peak detector 11, a low pass filter 12 and a voltage amplifier 13. The amplifier 10 amplifies an input voltage $v_i$ and an amplified output voltage $v_o$ is fed to the peak detector 11 which, by detecting the peak voltage of the output voltage $v_o$, provides a DC voltage to the filter 12. A filtered DC voltage $V_d$ is fed to the voltage amplifier 13 which generates a DC voltage $V_g$ depending upon the difference between the voltage $V_d$ and a reference voltage $V_r$. The amplifier 10 varies its gain in response to the voltage $V_g$. The peak detector 11, the filter 12 and the voltage amplifier 13 form a negative feedback circuit and generate the voltage $V_g$ to maintain the amplitude of the amplified output voltage $v_o$ constant.

Figure 2:
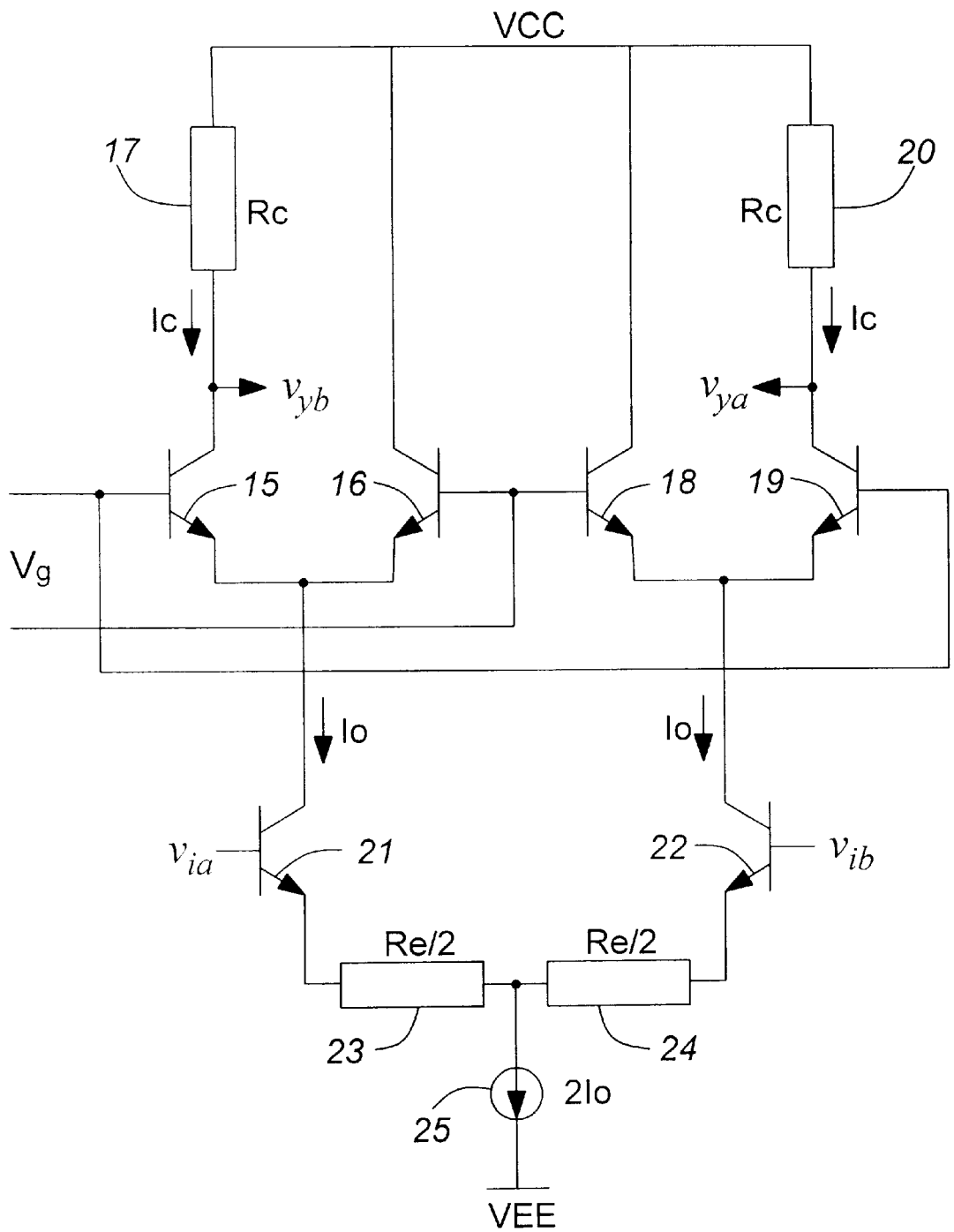
FIG. 2 is a circuit diagram of an input stage amplifier of a voltage controlled amplifier shown in FIG. 1.

FIG. 2 shows an input stage amplifier of the voltage controlled amplifier 10 which includes a pair of emitter coupled transistors 15, 16 with a resistor 17 and another pair of emitter coupled transistors 18, 19 with a resistor 20. Each of the resistors 17, 20 has a resistance of Rc. The bases of the transistors 18, 19 are connected to the bases of the transistors 16, 15, respectively. It further includes a signal input circuit having transistors 21 and 22, the collectors of which are connected to the coupled emitters of the transistors 15, 16 and of the transistors 18, 19, respectively. The emitters of the transistors 21, 22 are coupled through a pair of emitter resistors 23, 24, each having a resistance of $R_e/2$. The junction of the resistors 23, 24 is connected to a current sink circuit 25. Constant current $I_o$ flows in each of the transistors 21, 22. The input voltage $v_i$ (differential voltages $v_{ia}$, $v_{ib}$), which is to be amplified, is fed to the bases of the transistors 21, 22. The voltage $V_g$ is fed between the bases of the transistors 16 (18) and 15 (19). In order to amplify the input voltage $v_i$ within the linear range, its maximum voltage $v_{imax}$ must be:

$$v_{imax} \leq I_o \times R_e \quad (1)$$

For wide dynamic range, $I_o \times R_e$ must be made as large as possible. At the same time, $I_o$ and $R_e$ have significant contributions to the equivalent input noise of the amplifier. The noise power of the noise source associated with the emitter resistors 23, 24 is proportional to their resistance value. The shot noise of the transistors 21,22 is proportional to the tail current $I_o$. For low equivalent input noise, the emitter resistance $R_e$ and the tail current $I_o$ must be as small as possible. The two requirements, wide input dynamic range and low equivalent input noise, are conflicting requirements. In most cases, satisfaction of wide input dynamic range prevails over input noise.

Collector current $I_c$ of the transistors 15 and 16 is divided into two currents $mI_c$ and $(1-m)I_c$, where m ($0 \leq m \leq 1$) is a splitting factor and is controlled by the gain control voltage $V_g$. The input stage's gain G is given by:

$$G (R_c/R_e) \times m \quad (2)$$

To achieve good noise performance, the maximum gain (m=1) of the input stage amplifier must be high enough to reduce the contributions of the following stage of the voltage controlled amplifier 10 in the overall equivalent input noise of the AGC amplifier. In general, the gain G of 10 to 15 dB is considered acceptable. The splitting factor m affects the operating current of the transistors 15, 16 and in most practical applications is limited to a minimum value of 0.1.

The output dynamic range of the input stage amplifier is reduced by a maximum factor of 10 (20 dB), relative to the input dynamic range. If the input dynamic range is 200 (46 dB), the output dynamic range of the amplifier will be minimum 20 (26 dB).

If the maximum gain is 10 to 15 dB (m=1), the minimum gain (m=0.1) will be −10 dB to −5 dB (0.3 to 0.6). The maximum input amplitude in the following stage is not reduced significantly and will force the following stage to operate at high equivalent input noise.

II. Embodiment

II-1. Circuits of the Embodiment (a) AGC Amplifier

Figure 3:
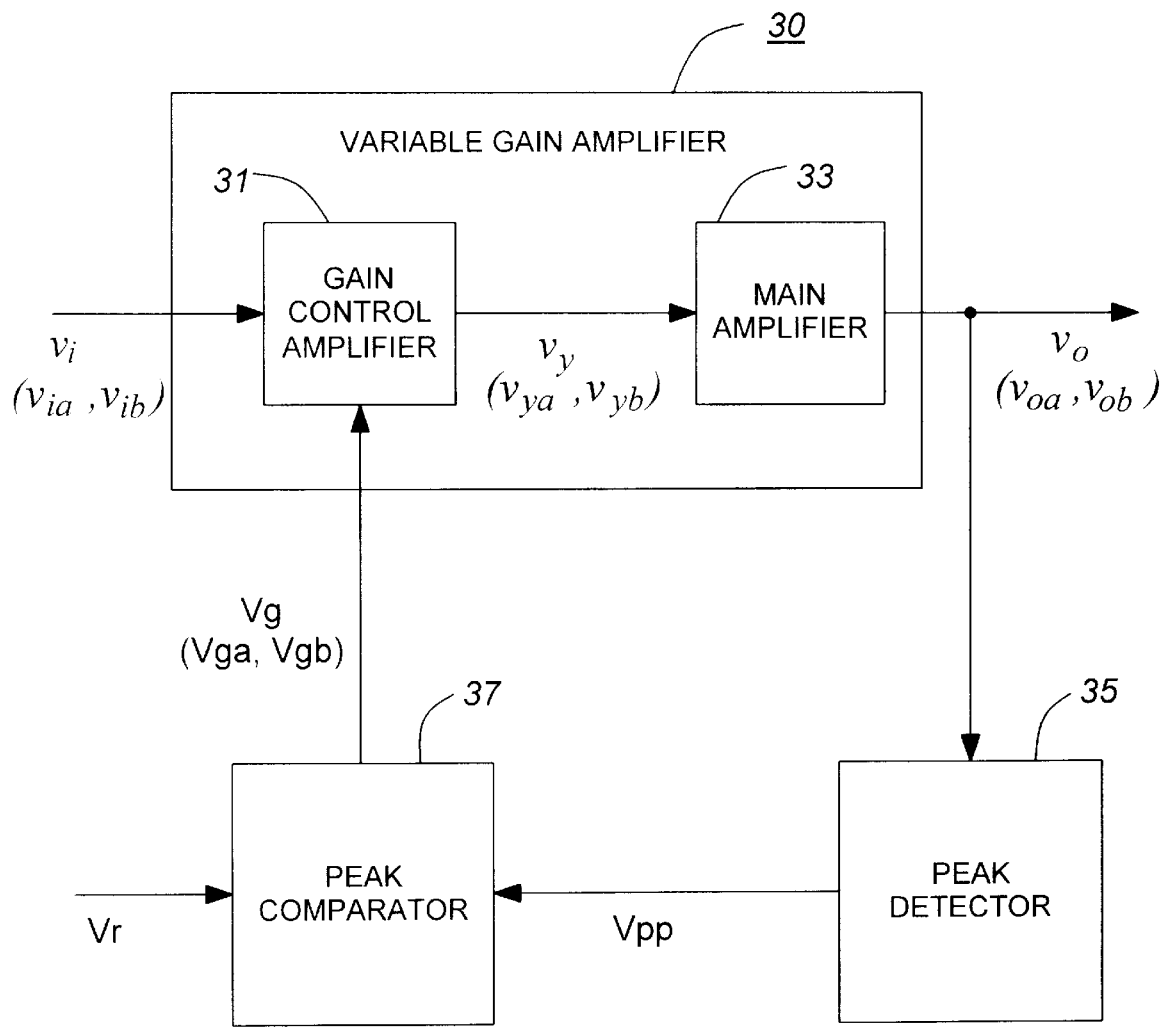
FIG. 3 is a block diagram of an AGC amplifier according to an embodiment of the present invention.

FIG. 3 shows an AGC amplifier according to an embodiment of the present invention. In FIG. 3, the AGC amplifier includes a variable gain amplifier 30 having a gain control amplifier 31 and a main amplifier 33, a peak detector 35 and a peak comparator 37. An input voltage $v_i$ (differential voltages $v_{ia}$, $v_{ib}$), which is to be amplified, is fed to the gain control amplifier 31. The input voltage $v_i$ is first amplified by the gain control amplifier 31, the gain of which varies in response to a DC voltage $V_g$ provided by the peak comparator 37. An amplified voltage $v_y$ (differential voltages $v_{ya}$, $v_{yb}$) is further amplified by the main amplifier 33 which provides an amplified output voltage $v_o$ (differential voltages $v_{oa}$, $v_{ob}$). The output voltage $v_o$ is fed to the peak detector 35 for detecting a peak value thereof. The peak detector 35 holds the output peak voltage by fast charging a capacitor at the maximum amplitude and holding that value (short charge time and long discharge time). Detected peak voltage $V_{pp}$ is provided to the peak comparator 37 which compares the peak voltage $V_{pp}$ to a reference voltage $V_r$ (a desired voltage). The peak comparator 37 includes a linear to logarithmic converter and generates a gain control voltage $V_g$ (differential voltages $V_{ga}$, $V_{gb}$) which varies depending upon the difference between the detected peak voltage $V_{pp}$ and the reference voltage $V_r$. In response to the gain control voltage $V_g$, the gain control amplifier 31 varies its gain to maintain the output voltage $v_o$ constant for a given dynamic range of the input voltage $v_i$. The input dynamic range and noise factor of the gain control amplifier 31 affect the AGC amplifier's performance.

(b) Gain Control Amplifier

Figure 4:
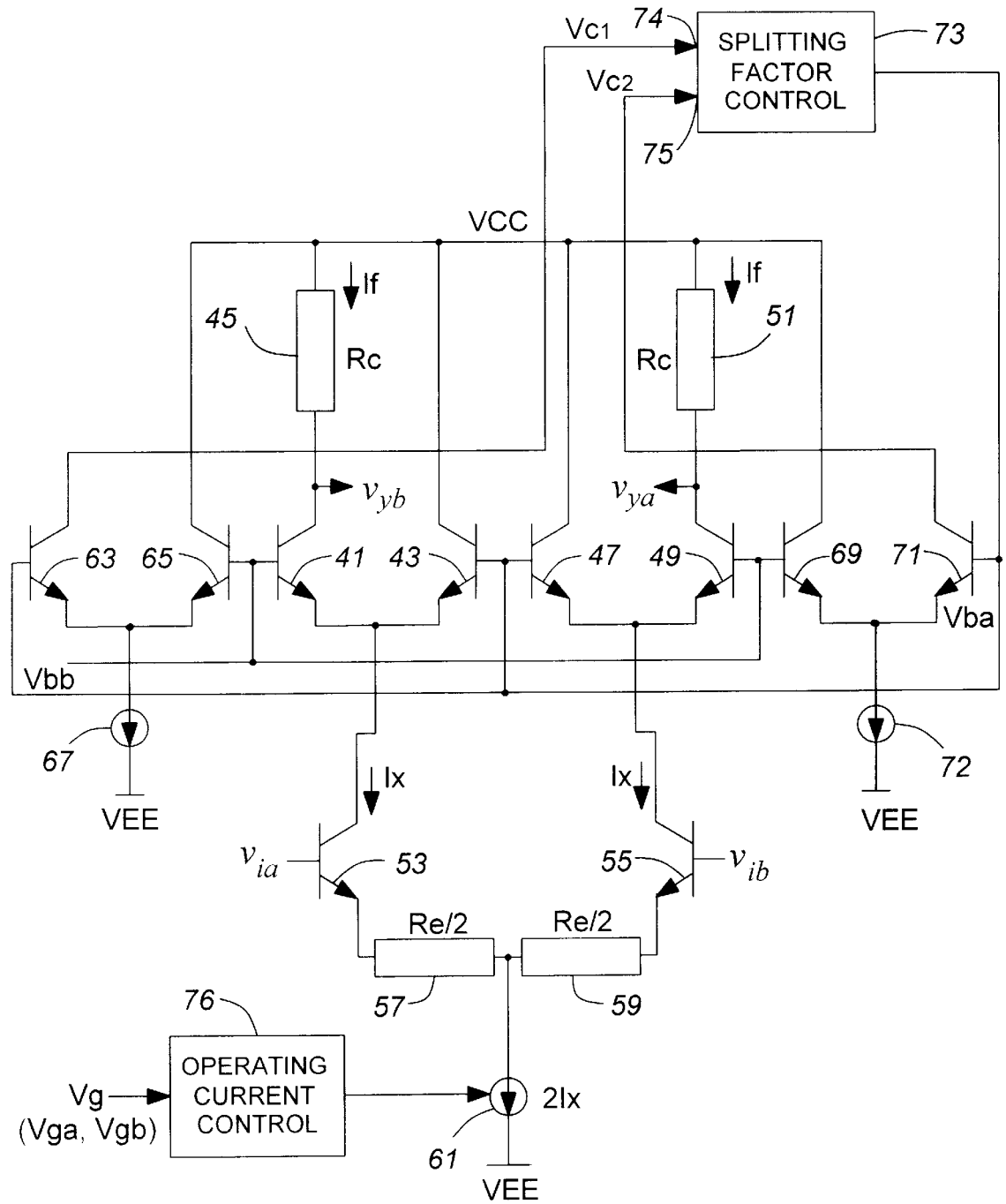
FIG. 4 is a circuit diagram of an input stage amplifier used in a variable gain amplifier shown in FIG. 3.

FIG. 4 shows the gain control amplifier 31 of the variable gain amplifier 30 shown in FIG. 3. In FIG. 4, the gain control amplifier includes five differential circuits and two control circuits.

A first differential circuit includes emitter coupled transistors 41, 43 and a load resistor 45 connected to the collector of the transistor 41. A second differential circuit includes transistors 47, 49 and another load resistor 51 connected to the collector of the transistor 49. The resistors 45, 51 have a resistance Rc. The resistors 45, 51 are connected to a high voltage terminal of voltage VCC (e.g., +5.0 V). The bases of the transistors 43 and 47 are connected to each other. A third differential circuit includes transistors 53, 55, the emitters of which are coupled through a pair of emitter resistors 57, 59 having a resistance $R_e/2$. The junction of the resistors 57, 59 is connected to a current sink circuit 61. The collector of the transistor 53 is connected to the coupled emitters of the transistors 41, 43. The collector of the transistor 55 is connected to the coupled emitters of the transistors 47, 49. A fourth differential circuit includes emitter coupled transistors 63, 65, the emitters of which are connected to a current sink circuit 67 which sinks constant current $I_o$. A fifth differential circuit includes emitter coupled transistors 69, 71, the emitters of which are connected to a current sink circuit 72 which sinks constant current $I_o$. The collectors of the transistors 63, 71 are connected to the collectors of the transistors 41, 49, respectively. The collectors of the transistors 65, 69 are connected to the high voltage terminal. The current sink circuits 61, 67, 72 are connected to a low voltage terminal of voltage VEE (e.g., −5.0 V). The bases of the transistors 65, 41, 49, 69 are coupled together. The bases of the transistors 63, 43, 47, 71 are coupled together.

One of the two control circuits is a splitting factor control circuit 73, the input terminals 74, 75 of which are connected to the collectors of the transistors 41 and 49 of the first and second differential circuits. In response to a voltage difference between voltages $V_{c1}$ and $V_{c2}$ at the input terminals 74 and 75, the splitting factor control circuit 73 supplies the base voltage $V_{ba}$ to the bases of the transistors 43, 47, 63 and 71. The base voltage $V_{bb}$, constant voltage, is fed to the bases of the transistors 41, 65, 49 and 69 by a DC voltage source (not shown) and the bases are AC grounded. The control circuit 73 and fourth and fifth differential circuits perform current split functions to split currents flowing in the load resistors 45, 51.

The other control circuit is an operating current control circuit 76 which, in response to the gain control voltage $V_g$ (differential voltages $v_{ga}$, $v_{gb}$) from the peak comparator 37 shown in FIG. 3, generates a tail current control voltage $V_{csx}$ fed to the current sink circuit 61. The operating current control circuit 76 controls current $I_x$ flowing in the transistors 53, 55. Current $I_f$ flows in the collector of each of the transistors 41, 49.

The input differential voltages $v_{ia}$, $v_{ib}$, which are to be amplified, are fed to the bases of the transistors 53, 55, respectively. The amplified differential voltages $v_{ya}$, $v_{yb}$ are provided from the bases of the transistors 53, 55 to the main amplifier 33.

Figure 5:
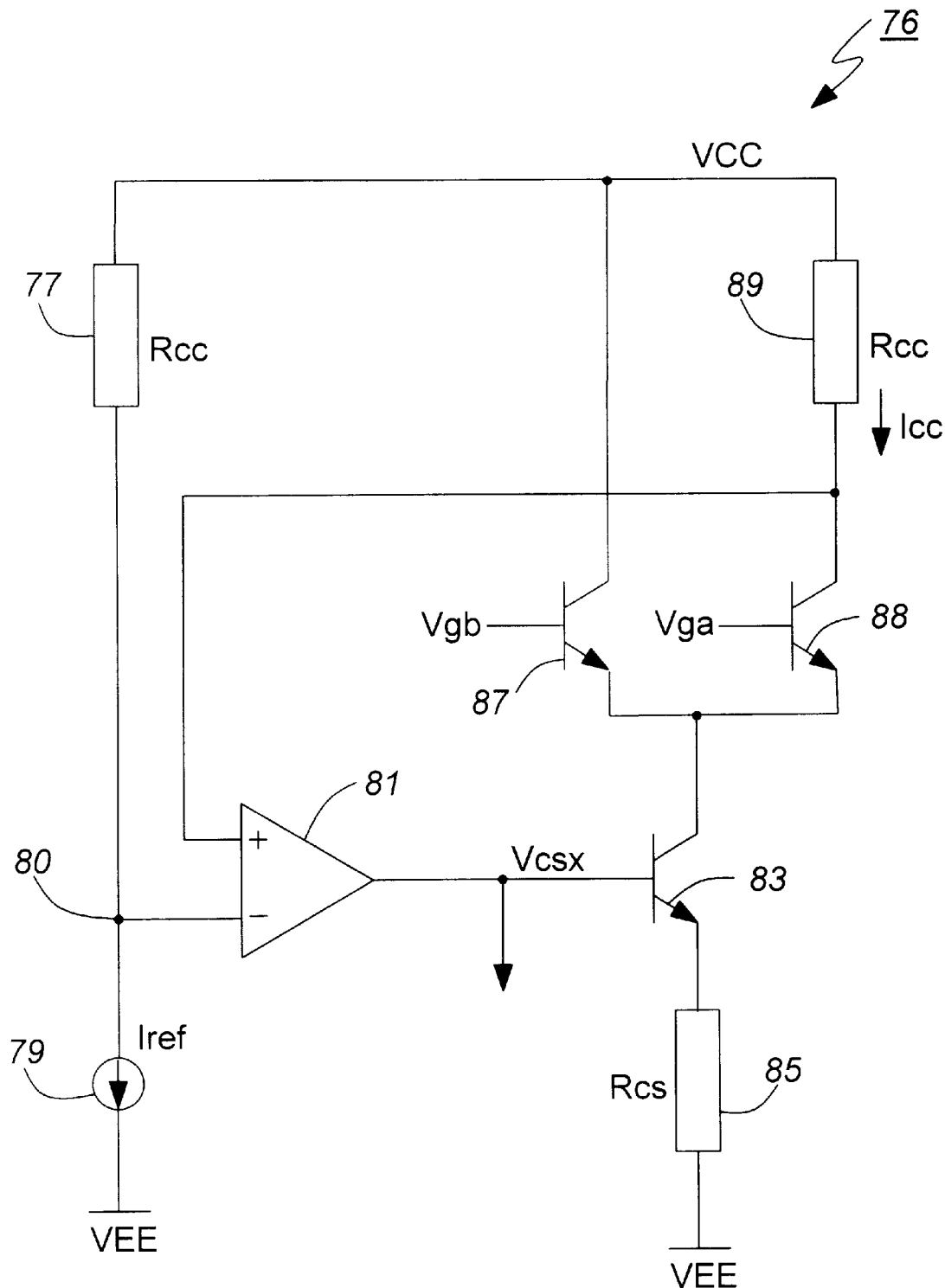
FIG. 5 is a circuit diagram of an operating current control circuit used in the input stage amplifier shown in FIG. 4.

FIG. 5 shows the operating current control circuit 76 which generates the tail current control voltage $V_{csx}$ proportional to the gain control voltage $V_g$. In FIG. 5, a resistor 77 and a current sink circuit 79 are connected in series between the high and low voltage terminals of voltages VCC and VEE. The junction 80 of the resistor 77 and the current sink circuit 79 is connected to an inverting input terminal of an operational amplifier 81, the output terminal of which is connected to the base of a transistor 83 of a transistor circuit. The emitter of the transistor 83 is connected to the low voltage terminal through a resistor 85. The collector of the transistor 83 is connected to coupled emitters of a pair of transistors 87, 88. The collector of the transistor 88 is connected to a non-inverting input terminal of the operational amplifier 81 and connected to the high voltage terminal through a resistor 89. The resistors 77, 89 have a resistance Rcc. The resistor 85 has a resistance Rcs.

Constant reference current $I_{ref}$ flows in the current sink circuit 79. The differential gain control voltages $V_{ga}$, $V_{gb}$ are fed to the bases of the transistors 88, 87. The operational amplifier 81 varies the voltage $V_{csx}$ which is proportional of Rcc ($I_{ref}-I_{cc}$), $I_{cc}$ being current flowing in the resistor 89. The voltage $V_{csx}$ is fed to the transistor 61 of the gain control amplifier shown in FIG. 4.

Figure 6:
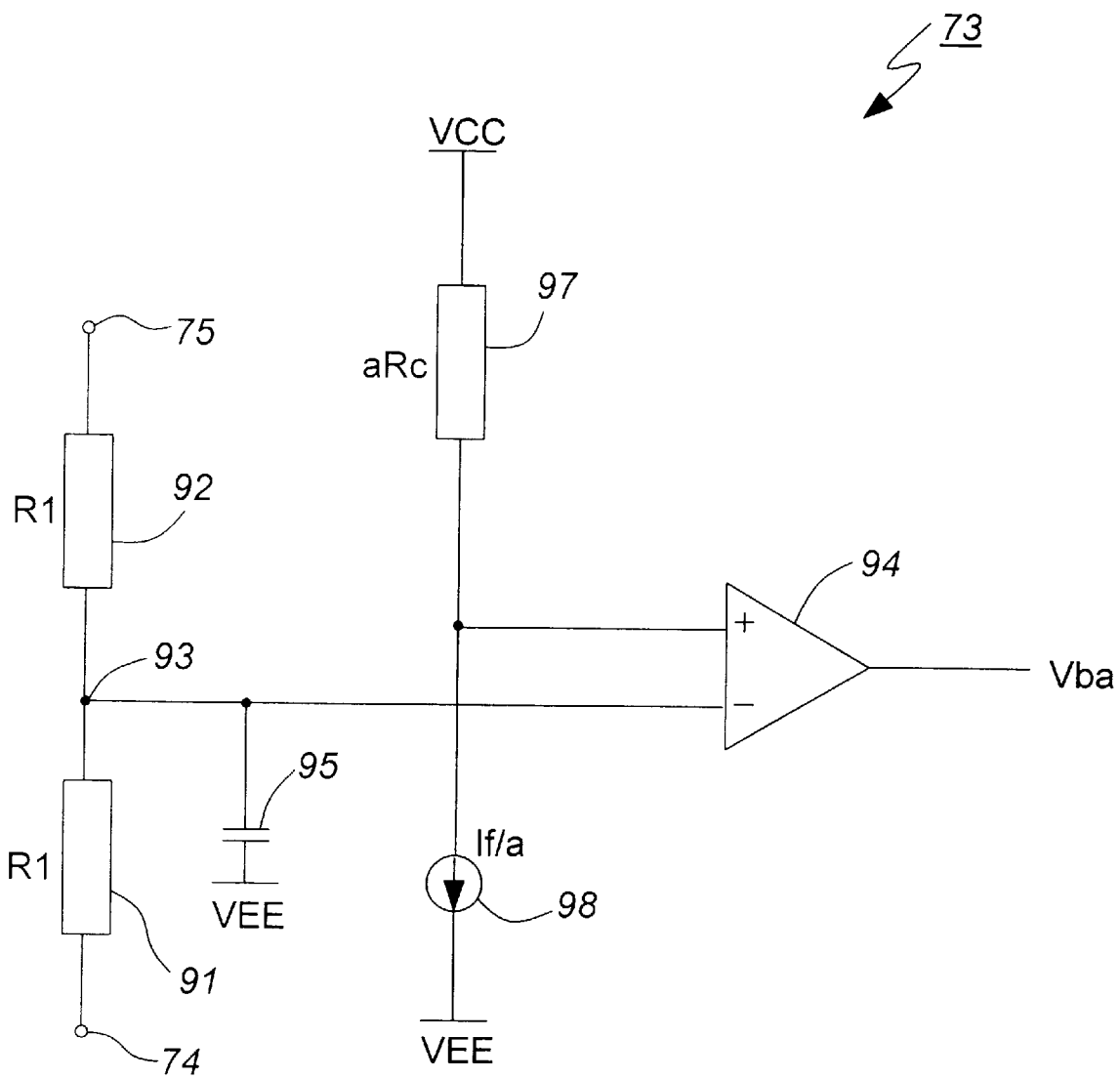
FIG. 6 is a circuit diagram of a splitting factor control circuit used in the input stage amplifier shown in FIG. 4.

FIG. 6 shows the splitting factor control circuit 73. In FIG. 6, a voltage divider of two series-connected resistors 91 and 92 is connected between the input terminals of the splitting factor control circuit 73. The junction 93 of the resistors 91 and 92 is connected to an inverting input terminal of an operational amplifier 94 and to the low voltage terminal through a capacitor 95. A resistor 97 and a current sink circuit 98 are connected in series between the high and low voltage terminals. The junction of the resistor 97 and the current sink circuit 98 is connected to a non-inverting input terminal of the operational amplifier 94. The resistor 97 has a resistance of aRc and the current of the sink circuit 98 is $I_f/a$, a being an integer. The output terminal of the operational amplifier 94 is connected to the bases of the transistors 43, 47, 63 and 71 shown in FIG. 4, so as to vary their base voltage $V_{ba}$ to control the gain of the gain control amplifier. The circuit shown in FIG. 6 forces the base voltage $V_{ba}$ such that the current flowing in the resistors 45, 51 is constant and equal to a fixed value $I_f$ ($I_f \geq I_{xmin}$, for maximum gain).

II-2. Operation of the Circuits

Figure 7:
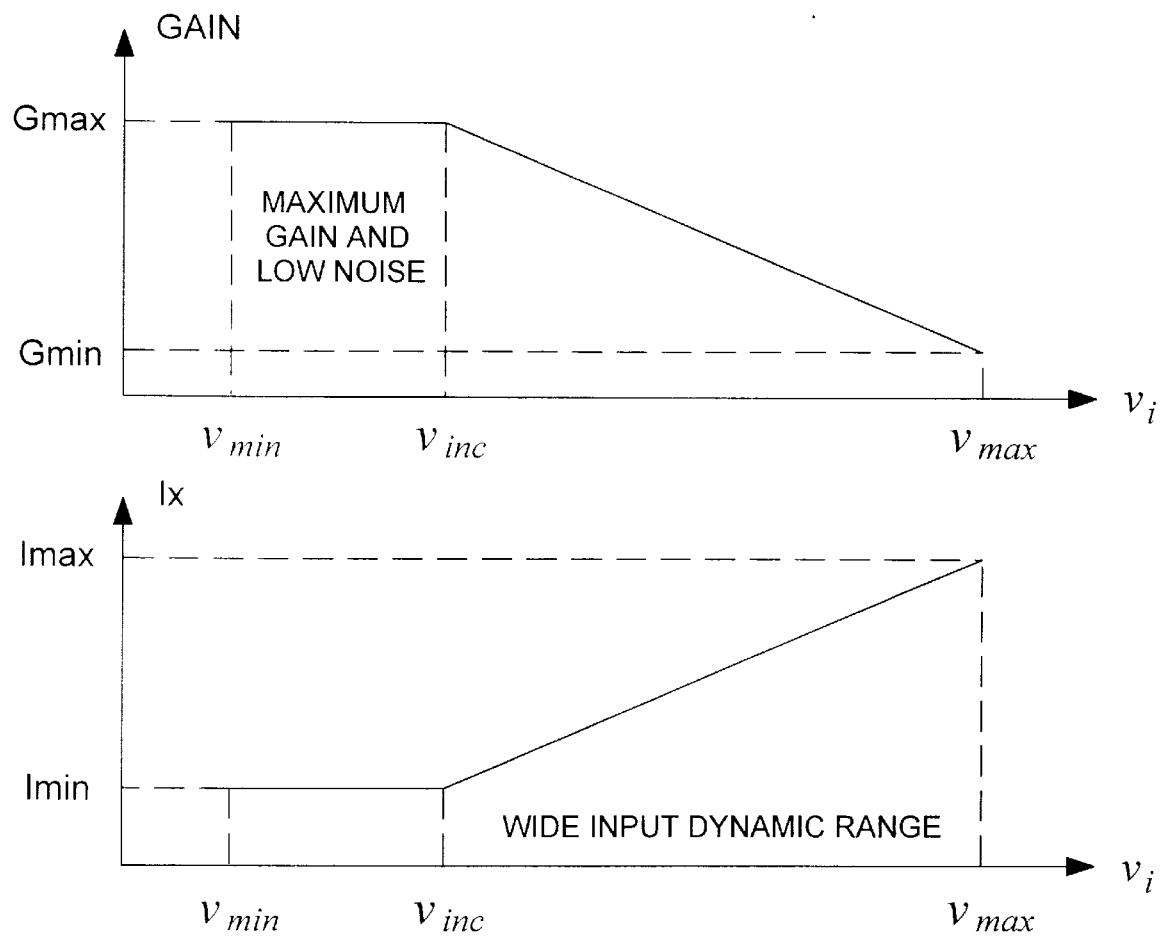
FIGS. 7A and 7B illustrate gain and operating current variation with input signal amplitude.

In response to the tail current control voltage $V_{csx}$, each of the currents $I_x$ flowing in the transistors 53, 55 varies linearly between its minimum and maximum values $I_{min}$ and $I_{max}$ as shown in FIG. 7A and 7B. With the minimum operating current $I_{min}$, the maximum gain $G_{max}$ is achieved for the minimum input voltage $V_{min}$. With the maximum operating current $I_{max}$, the minimum gain $G_{min}$ is achieved for the maximum input voltage $v_{max}$. When the gain control amplifier 31 operates at the maximum gain $G_{max}$, the transistors 41, 65, 49, 69 do not carry any current and the circuit operates as a cascode amplifier at the minimum operating current $I_{min}$:

$$I_x = I_{min} = I_f \qquad (3)$$

The operating current $I_x$ can be optimized to achieve the low equivalent input noise for the minimum input voltage $v_{min}$. For minimum noise, the gain control amplifier 31 can operate at the maximum gain $G_{max}$.

When the amplitude of the input voltage $v_i$ is greater than the maximum acceptable value for the maximum gain $G_{max}$, the operating current $I_x$ increases to maintain the linearity of the gain control amplifier 31. The condition for linearity, for any input signal amplitude $v_{inx}$, is similar to equation (1).

$$I_x \times R_e \geq v_{inx} \qquad (4)$$

The operating current $I_x$ has the maximum value $I_{max}$ at the maximum input voltage $v_{max}$. The gain and operating current variation with the input signal amplitude for the gain control amplifier 31 is shown in FIGS. 7A and 7B. The gain and operating current have a linear variation with the input signal amplitude.

Having the maximum gain and the minimum operating current $I_{min}$ when the input voltage is very small (signal to nose ratio low), allows the amplifier to operate at the minimum noise and to introduce the minimum signal to noise ratio degradation. When the input signal amplitude is high (high signal to noise ratio) the amplifier will increase the input dynamic range to maintain linearity. The power dissipation of the amplifier is a function of the input voltage amplitude.

Figure 8:
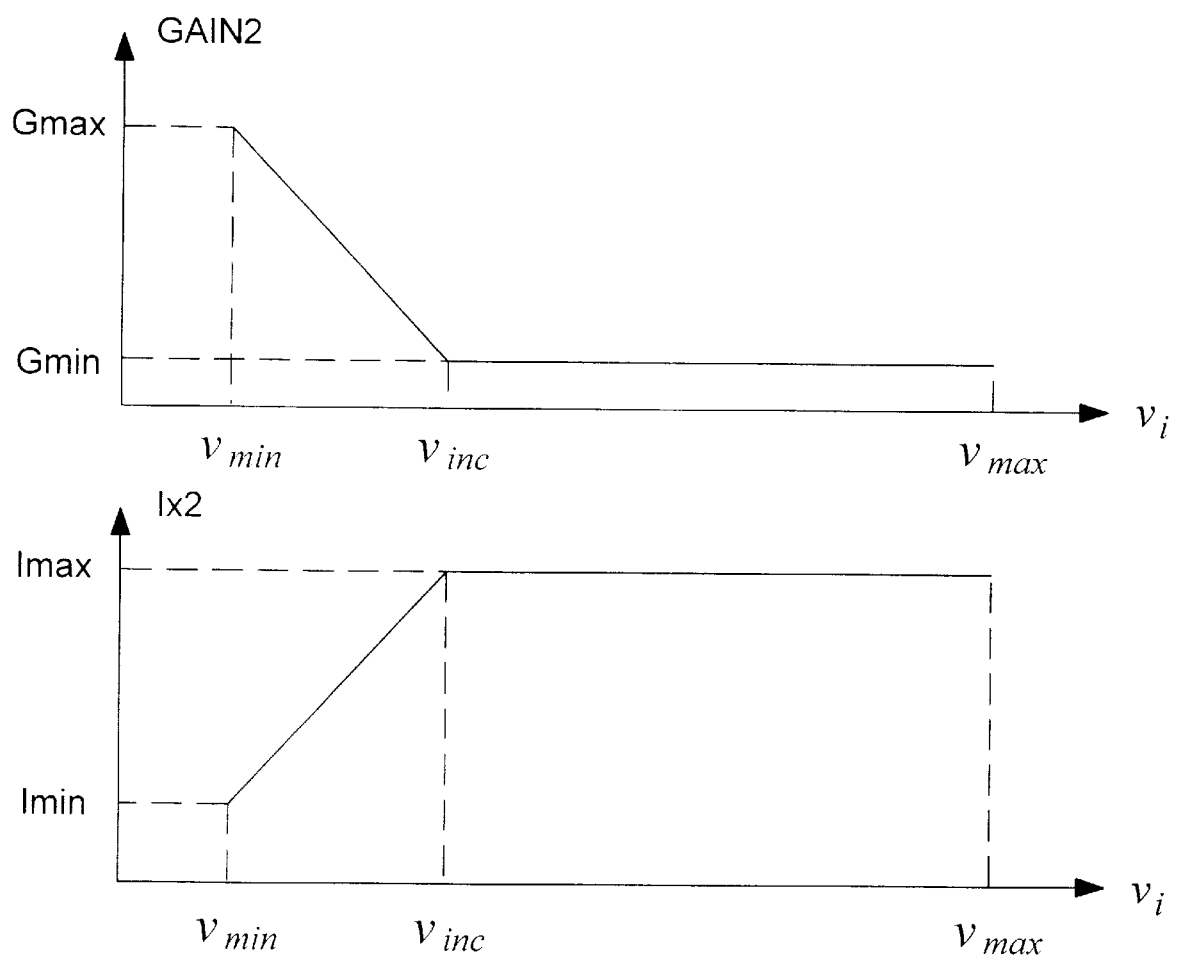
FIGS. 8A and 8B illustrate gain and operating current for following stages.

If the same circuit is used for following variable gain stages of the main amplifier 33, the gain and operating current variation with the input signal is shown in FIGS. 8A and 8B. In the gain control amplifier 31, its gain and the operation current have a linear variation with the input voltage amplitude.

The voltages at the collectors of the transistors 49 and 41 are symmetrical and the AC component of the voltage at the inverting input terminal of the operational amplifier 94 is zero. When the operating current $I_x$ increases further than the $I_f$ value, the base voltage $V_{ba}$ controlling the splitting factor $m_b$ ($m_b=1-m$) increases to maintain constant currents flowing in the two resistors 45, 51.

It is assumed that the scaling factor between the pairs of the transistors (63, 65), (43, 41), (47, 49), (71, 69) is the same and equal to k:1. The correlation between the splitting factor m and the operating current $I_x$ is given by:

$$mI_x+(1-m)I_o=I_f$$

or $$I_x=I_o+(I_f-I_o)/m \qquad (5)$$

Therefore, the current $I_o$ must be less than the current If. For ($I_f-I_o$) small and $0.1 \leq m \leq 1$, the variation of $I_x$ with m is quasi linear.

In order to satisfy the noise factor at the minimum input voltage or over a given range of minimum voltage amplitudes, it is chosen that the emitter resistors and the operating current $I_{min}$ (where $I_{min} \leq I_f$). The load resistors 45, 51 result from the maximum gain requirements (10 dB to 15 dB minimum for the input stage), and power supply operating range. The maximum operating current $I_{max} \geq v_{imax}/R_e$ result from the maximum input voltage amplitude for linear operation, $v_{imax}$ and using the value chosen for $R_e$. The minimum gain of the amplifier is determined by the maximum output voltage $v_{ya}$ and $v_{yb}$ for linear operation. To set the minimum gain of the gain control amplifier 31, the additional current sources $I_o$ of the current sink circuits 67, 72 are:

$$I_o=(I_f-I_{max} \times m_{min})/(1-I_{min}) \qquad (6)$$

The currents $I_o$ allow to set the minimum gain $G_{min}$ of the amplifier without affecting the other parameters. In the absence of the current sources 67, 72, the value of $I_f$ must be changed to satisfy the condition $I_f-(I_{max} \times m_{min})=0$. This will affect the maximum gain of the amplifier.

Although particular embodiments of the present invention have been described in detail, it should be appreciated that numerous variations, modifications, and adaptations may be made without departing from the scope of the present invention as defined in the claims. For example, the gain control amplifier is compatible with a single-ended application. Transistors of a different type may be used and the current sink circuits may be replaced with current source circuits.

What is claimed is:

1. A gain control amplifier for amplifying an input voltage and providing an amplified output voltage, comprising:
    a first differential circuit comprising first and second transistors, the emitters of which are coupled, and a first load element connected to the collector of the first transistor;
    a second differential circuit comprising third and fourth transistors, the emitters of which are coupled, and a second load element connected to the collector of the fourth transistor, the bases of the third and fourth transistors being coupled to the bases of the second and first transistors, respectively, the amplified output voltage being provided from the collectors of the first and fourth transistors;
    a third differential circuit comprising fifth and sixth transistors, the emitters of which are coupled through a pair of resistance elements, the junction of the resistance elements being connected to a first current circuit, the collector of the fifth transistor being connected to the coupled emitters of the first and second transistors, the collector of the sixth transistor being connected to the coupled emitters of the third and fourth transistors, the input voltage being fed to the bases of the fifth and sixth transistors; and
    current split means for splitting current flowing in the first and second load elements from the respective transistors,
    the current split means comprising:
        fourth differential circuit for splitting the current flowing in the first load element from the first transistor, the fourth differential circuit comprising seventh and eighth transistors, the emitters of which are coupled, the coupled emitters being connected to a second current circuit, the collector of the seventh transistor being connected to the collector of the first transistor, the bases of the seventh and eight transistors being connected to the bases of the second and first transistors, respectively;
        fifth differential circuit for splitting the current flowing in the second load element from the fourth transistor, the fifth differential circuit comprising ninth and tenth transistors, the emitters of which are coupled, the coupled emitters being connected to a third current circuit, the collector of the tenth transistor being connected to the collector of the fourth transistor, the bases of the ninth and tenth transistors being connected to the bases of the fourth and third transistors, respectively; and
        split control means for controlling currents flowing in the transistors of the differential circuits in response to a voltage difference between the voltages at the collectors of the first and fourth transistors.

2. The gain control amplifier of claim 1, wherein the split control means comprises base voltage control means for generating a variable base voltage in response to the voltage difference, the variable base voltage being fed to the bases of the transistors of the first, second, fourth and fifth differential circuits.

3. The gain control amplifier of claim 2, wherein the base voltage control means comprises:
    voltage dividing means for dividing the load voltage; and
    first operational means for providing the variable base voltage in response to a divided voltage from the voltage dividing means.

4. The gain control amplifier of claim 3, wherein the first operational means comprises:
    means for providing a first reference voltage; and
    an operational amplifier for amplifying a voltage difference between the divided voltage and the first reference voltage to provide the variable base voltage to the bases of the second, third, seventh and tenth transistors.

5. The gain control amplifier of claim 4, wherein the voltage dividing means comprises a series-connected first and second resistor elements having equal resistance.

6. The gain control amplifier of claim 5, wherein the bases of the first, fourth, eighth and ninth transistors are provided with constant DC voltage.

7. The gain control amplifier of claim 6, wherein the input voltage and the amplified output voltage are differential.

8. The gain control amplifier of claim 1, further comprising current control means for controlling current of the first current circuit in response to an input variable voltage.

9. The gain control amplifier of claim 8, wherein the current control means comprises voltage generation means for generating a current control voltage in response to the input variable voltage and a second reference voltage, the current control voltage varying the current of the first current circuit.

10. The gain control amplifier of claim 9, wherein the voltage generation means comprises:
   a transistor circuit for providing a variable output voltage in response to the input variable voltage and the current control voltage; and
   second operational means for providing the current control voltage in response to the variable output voltage and the second reference voltage.

11. The gain control amplifier of claim 10, wherein the second operational means comprises a second operational amplifier for amplifying a voltage difference between the variable output voltage and the second reference voltage to provide the current control voltage to the first current circuit.

12. The gain control amplifier of claim 11, wherein the transistor circuit comprises cascade connected eleventh and twelfth transistors, the current control voltage being fed to the base of the eleventh transistor, the variable output voltage being varied with regard to current flowing in the twelfth transistor.

13. A variable gain amplifier comprising:
   an input stage amplifier for amplifying an input voltage; and
   a main amplifier for further amplifying an input stage amplified voltage and providing an output voltage, the input stage amplifier comprising a gain control amplifier,
   the gain control amplifier comprising:
      a first differential circuit comprising first and second transistors, the emitters of which are coupled, and a first load element connected to the collector of the first transistor;
      a second differential circuit comprising third and fourth transistors, the emitters of which are coupled, and a second load element connected to the collector of the fourth transistor, the bases of the third and fourth transistors being coupled to the bases of the second and first transistors, respectively, the amplified output voltage being provided from the collectors of the first and fourth transistors;
      a third differential circuit comprising fifth and sixth transistors, the emitters of which are coupled through a pair of resistance elements, the junction of the resistance elements being connected to a first current circuit, the collector of the fifth transistor being connected to the coupled emitters of the first and second transistors, the collector of the sixth transistor being connected to the coupled emitters of the third and fourth transistors, the input voltage being fed to the bases of the fifth and sixth transistors; and
      current split means for splitting current flowing in the first and second load elements from the respective transistors,
      the current split means comprising:
         fourth differential circuit for splitting the current flowing in the first load element from the first transistor, the fourth differential circuit comprising seventh and eighth transistors, the emitters of which are coupled, the coupled emitters being connected to a second current circuit, the collector of the seventh transistor being connected to the collector of the first transistor, the bases of the seventh and eight transistors being connected to the bases of the second and first transistors, respectively;
         fifth differential circuit for splitting the current flowing in the second load element from the fourth transistor, the fifth differential circuit comprising ninth and tenth transistors, the emitters of which are coupled, the coupled emitters being connected to a third current circuit, the collector of the tenth transistor being connected to the collector of the fourth transistor, the bases of the ninth and tenth transistors being connected to the bases of the fourth and third transistors, respectively; and
         split control means for controlling currents flowing in the transistors of the differential circuits in response to a voltage difference between the voltages at the collectors of the first and fourth transistors.

14. An automatic gain control amplifier comprising:
   a variable gain amplifier for amplifying an input voltage and providing an amplified voltage;
   detection means for detecting variations of the output voltage of the variable gain amplifier; and
   means for comparing the detected output to a reference voltage and providing a gain control voltage to the variable gain amplifier,
   the variable gain amplifier comprising: an input stage amplifier for amplifying an input voltage; and a main amplifier for further amplifying an input stage amplified voltage and providing an output voltage, the input stage amplifier comprising a gain control amplifier,
   the gain control amplifier comprising:
      a first differential circuit comprising first and second transistors, the emitters of which are coupled, and a first load element connected to the collector of the first transistor;
      a second differential circuit comprising third and fourth transistors, the emitters of which are coupled, and a second load element connected to the collector of the fourth transistor, the bases of the third and fourth transistors being coupled to the bases of the second and first transistors, respectively, the amplified output voltage being provided from the collectors of the first and fourth transistors;
      a third differential circuit comprising fifth and sixth transistors, the emitters of which are coupled through a pair of resistance elements, the junction of the resistance elements being connected to a first current circuit, the collector of the fifth transistor being connected to the coupled emitters of the first and second transistors, the collector of the sixth transistor being connected to the coupled emitters of the third and fourth transistors, the input voltage being fed to the bases of the fifth and sixth transistors; and
      current split means for splitting current flowing in the first and second load elements from the respective transistors,
      the current split means comprising:
         fourth differential circuit for splitting the current flowing in the first load element from the first transistor, the fourth differential circuit comprising seventh and eighth transistors, the emitters of which are coupled, the coupled emitters being connected to a second current circuit, the collector of the seventh transistor being connected to the collector of the first transistor, the bases of the seventh and eight transistors being connected to the bases of the second and first transistors, respectively;

fifth differential circuit for splitting the current flowing in the second load element from the fourth transistor, the fifth differential circuit comprising ninth and tenth transistors, the emitters of which are coupled, the coupled emitters being connected to a third current circuit, the collector of the tenth transistor being connected to the collector of the fourth transistor, the bases of the ninth and tenth transistors being connected to the bases of the fourth and third transistors, respectively; and split control means for controlling currents flowing in the transistors of the differential circuits in response to a voltage difference between the voltages at the collectors of the first and fourth transistors.

* * * * *